(12) United States Patent
Gambetta et al.

(10) Patent No.: US 11,551,126 B2
(45) Date of Patent: Jan. 10, 2023

(54) QUANTUM DATA POST-PROCESSING

(71) Applicant: International Business Machines Corporation, Armonk, NY (US)

(72) Inventors: Jay M. Gambetta, Yorktown Heights, NY (US); Ismael Faro Sertage, Chappaqua, NY (US); Andrew Wack, Millbrook, NY (US); Francisco Jose Martin Fernandez, Chappaqua, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 947 days.

(21) Appl. No.: 16/377,735

(22) Filed: Apr. 8, 2019

(65) Prior Publication Data

US 2020/0320421 A1 Oct. 8, 2020

(51) Int. Cl.
*G06N 10/00* (2022.01)
*G06F 30/20* (2020.01)

(52) U.S. Cl.
CPC .............. *G06N 10/00* (2019.01); *G06F 30/20* (2020.01)

(58) Field of Classification Search
CPC ........ G06N 10/00; G06N 20/00; G06F 30/00; G06F 30/20
USPC .................................. 706/62; 703/20, 14, 13
See application file for complete search history.

(56) References Cited

U.S. PATENT DOCUMENTS

| 5,920,327 A | 7/1999 | Seidensticker, Jr. |
|---|---|---|
| 6,141,445 A | 10/2000 | Castelli et al. |
| 6,529,899 B1 | 3/2003 | Kraft et al. |
| 7,009,533 B1 | 3/2006 | Wegener |
| 7,890,327 B2 | 2/2011 | Dorai et al. |
| 7,986,848 B2 | 7/2011 | Mignet et al. |
| 9,454,554 B1 | 9/2016 | St-Pierre |
| 9,881,256 B2 | 1/2018 | Hamze et al. |
| 2012/0084242 A1* | 4/2012 | Levin .............. B82Y 10/00 706/46 |
| 2017/0255629 A1 | 9/2017 | Thom et al. |
| 2017/0286852 A1 | 10/2017 | Rezaie et al. |

(Continued)

FOREIGN PATENT DOCUMENTS

WO 2010148169 A1 12/2010

OTHER PUBLICATIONS

Strasser, et al., "Multi-layered Image Caching for Distributed Rendering of Large Multiresolution Datasets," Eurographics Symposium on Parallel Graphics and Visualization (2006), 7 pages.

(Continued)

*Primary Examiner* — Cedric Johnson

(74) *Attorney, Agent, or Firm* — Amin, Turocy & Watson, LLP

(57) ABSTRACT

Techniques for quantum data post-processing are provided. In one example, a system includes a quantum programming component and a post-processing component. The quantum programming component receives quantum output data that includes a set of quantum results for a quantum circuit in response to simulation of the quantum circuit. The post-processing component adjusts the quantum output data associated with the quantum circuit based on client system data indicative of information for a client system that consumes the quantum output data.

18 Claims, 10 Drawing Sheets

(56) References Cited

U.S. PATENT DOCUMENTS

2018/0300286 A1    10/2018  Raymond
2019/0095561 A1*    3/2019  Pednault ............... G06N 10/00

OTHER PUBLICATIONS

Prasher, et al., "Multiresolution Amalgamation: Dynamic Spatial Data Cube Generation," Copyright (c) 2004, Australian Computer Society, Inc. This paper appeared at the 15th Australasian Database Conference (ADC2004), Dunedin. Conferences in Research and Practice in Information Technology, vol. 27., 9 pages.

* cited by examiner

QUANTUM DATA POST-PROCESSING

BACKGROUND

The subject disclosure relates to quantum computing and, more specifically, to post-processing of quantum computing data.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products for facilitating quantum data post-processing are described.

According to an embodiment, a system can comprise a quantum programming component and a post-processing component. The quantum programming component can receive quantum output data that includes a set of quantum results for a quantum circuit in response to simulation of the quantum circuit. The post-processing component can adjust the quantum output data associated with the quantum circuit based on client system data indicative of information for a client system that consumes the quantum output data.

According to another embodiment, a computer-implemented method is provided. The computer-implemented method can comprise receiving, by a system operatively coupled to a processor, quantum output data generated by a quantum circuit in response to simulation of the quantum circuit. The computer-implemented method can also comprise adjusting, by the system, the quantum output data associated with the quantum circuit based on client system data indicative of information for a client system that receives the quantum output data.

According to yet another embodiment, a computer program product for quantum data post-processing can comprise a computer readable storage medium having program instructions embodied therewith. The program instructions can be executable by a processor and cause the processor to receive, by the processor, quantum output data generated by a quantum circuit in response to simulation of the quantum circuit. The program instructions can also cause the processor to adjust, by the processor, the quantum output data associated with the quantum circuit based on client system data indicative of a set of requirements for a client system that receives the quantum output data.

DETAILED DESCRIPTION

Figure 1:
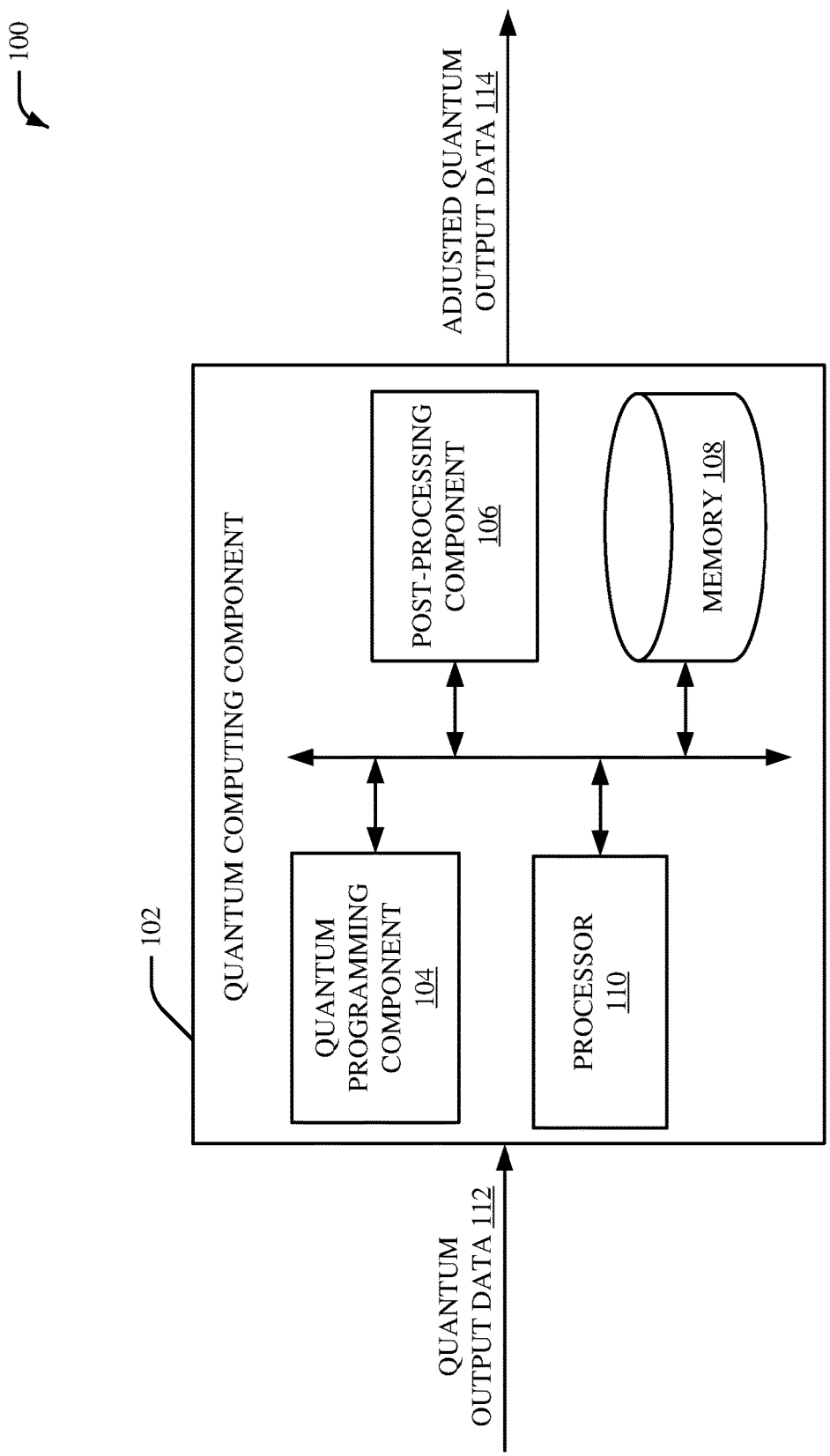
FIG. 1 illustrates a block diagram of an example, non-limiting system that includes a quantum computing component in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing employs quantum physics to encode information rather than binary digital techniques based on transistors. For example, a quantum computer can employ quantum bits (e.g., qubits) that operate according to a superposition principle of quantum physics and an entanglement principle of quantum physics. The superposition principle of quantum physics allows each qubit to represent both a value of "1" and a value of "0" at the same time. The entanglement principle of quantum physics states allows qubits in a superposition to be correlated with each other. For instance, a state of a first value (e.g., a value of "1" or a value of "0") can depend on a state of a second value. As such, a quantum computer can employ qubits to encode information rather than binary digital techniques based on transistors. Often times, it is desirable to simulate a quantum computer. Conventionally, a quantum computer can be employed for quantum simulation. For instance, a quantum simulator can employ a quantum computer to perform a set of calculations to determine information associated with a quantum system. In one example, a quantum simulator can employ a quantum computer to perform a set of calculations and to provide results associated with the quantum simulator. However, results associated with a quantum simulator generally contain a vast amount of data. As such, providing and/or analyzing results associated with a quantum simulator is generally inefficient and/or computationally expensive. As such, a conventional quantum computing system can be improved.

To address these and/or other issues, embodiments described herein include systems, computer-implemented methods, and/or computer program products for quantum data post-processing. For instance, quantum computing can include quantum programming that assembles one or more quantum programs. A quantum program can be a sequences of instructions executable on a quantum computer. Furthermore, a quantum program can include a set of quantum circuits. In response to a quantum program being executed, output of the quantum program that includes one or more results is generated. In an aspect, the output of the quantum program (e.g., the one or more results of the quantum program) can be analyzed. Furthermore, the output of the quantum program (e.g., the one or more results of the quantum program) can be optimized based on one or more requirements for a client system that receives the output of the quantum program. For example, the output of the quantum program (e.g., the one or more results of the quantum program) can be optimized based on one or more user requirements and/or one or more service requirements. In an embodiment, a post processing unit can be employed to generate different layers of data for quantum results regarding the one or more requirements for the client system. The different layers of data can be, for example, multi-layer results associated with the quantum output data. For instance, the post processing unit can obtain the output of the quantum program. The post processing unit can also analyze the one or more requirements for the client system (e.g., the one or more user requirements and/or the one or more service requirements). Furthermore, the post processing unit can adjust the output of the quantum program based on the analysis of the one or more requirements for the client system (e.g., the one or more user requirements and/or the one or more service requirements) to generate adjusted output of the quantum program. The adjusted output of the quantum program can be transmitted to the client system.

In another embodiment, a quantum circuit can be executed in a quantum computer. The quantum computer can be, for example, a backend of a quantum computing system. The quantum circuit can generate quantum output data that includes one or more results. In an aspect, the quantum output data generated by the quantum circuit can be collected. Furthermore, several representations of the quantum output data can be generated to allow to a client system (e.g., a user and/or a service) to consume the quantum output data in an efficient manner. In another aspect, a post-processing unit can repeatedly collect the quantum output data (e.g., approximately in real-time) from the quantum circuit. Furthermore, the post-processing unit can generate different versions of the quantum output data based on a set of requirements and/or a set of needs for the client system. Additionally or alternatively, the post-processing unit can scale the quantum output data based on one or more execution characteristics associated with the quantum circuit and/or one or more specifications associated with the quantum circuit. As such, an amount of time for the client system to receive the quantum output data (e.g., a specific class of results included in the quantum output data) can be reduced. Furthermore, the client system can receive different versions of the quantum output data (e.g., different versions from a same result included in the quantum output data) at different instances of time.

In yet another embodiment, the post-processing unit can generate multi-resolution results associated with the quantum output data. For instance, the post processing unit can obtain the output of the quantum program. The post processing unit can also analyze the one or more requirements for the client system (e.g., the one or more user requirements and/or the one or more service requirements). Furthermore, the post processing unit can generate several representations (e.g., several data layers) of the quantum output data with several resolutions. For instance, the post processing unit can process a high-resolution version of at least a portion of the quantum output data. The post processing unit can also extract several different versions of the portion of the quantum output data with less resolution than the high-resolution version. The high-resolution version and the several different versions of the portion of the quantum output data can be provided to a data storage system and/or a streaming service system for the client system. A low-resolution version of the portion of the quantum output data can be initially provided to the client system, followed by more detailed version (e.g., higher resolution versions) of the portion of the quantum output data. In certain embodiments, the post processing unit can generate the several representations of the quantum output data with the several resolutions based on one or more specifications associated with the quantum circuit such as, for example, pulse data associated with the quantum circuit, a number of counts associated with the quantum circuit, etc. In certain embodiments, the post processing unit can employ output from a particular detailed version of the quantum output data as input to generate another detailed version of the quantum output data. As such, performance of the quantum circuit can be improved. For instance, load of the quantum circuit can be optimized. Furthermore, balance of processing loads for the post processing unit can be balanced. An amount of time for a user associated with the client system to receive quantum output data from a quantum circuit can also be reduced. Moreover, a simulation process associated with a quantum circuit and/or efficiency of a quantum circuit can be improved.

FIG. 1 illustrates a block diagram of an example, non-limiting system 100 for providing quantum data post-processing in accordance with one or more embodiments described herein. In various embodiments, the system 100 can be a quantum computing system associated with technologies such as, but not limited to, quantum computing technologies, quantum programming technologies, quantum computer technologies, quantum chip technologies, quantum circuit technologies, quantum processor technologies, quantum device technologies, quantum simulation technologies, artificial intelligence technologies, machine learning technologies, network technologies, and/or other digital technologies. The system 100 can employ hardware and/or software to solve problems that are highly technical in nature, that are not abstract and that cannot be performed as a set of mental acts by a human. Further, in certain embodiments, some of the processes performed may be performed by one or more specialized computers (e.g., a quantum computer, one or more specialized processing units, a specialized computer with a quantum computing component, etc.) for carrying out defined tasks related to quantum computing. The system 100 and/or components of the system 100 can be employed to solve new problems that arise through advancements in technologies mentioned above, computer architecture, and/or the like. One or more embodiments of the system 100 can provide technical improvements to quantum computing systems, quantum programming systems, quantum computer systems, quantum chip systems, quantum circuit systems, quantum processor systems, quantum device systems, quantum simulation systems, artificial intelligence systems, machine learning systems, network systems, and/or other digital systems. One or more embodiments of the system 100 can also provide technical improvements to a quantum device (e.g., a quantum circuit, a quantum processor, a quantum computer, etc.) by improving processing performance of the quantum device, improving processing efficiency of the quantum device, improving processing characteristics of the quantum device, improving timing characteristics of the quantum device and/or improving power efficiency of the quantum device.

In the embodiment shown in FIG. 1, the system 100 can include a quantum computing component 102. As shown in FIG. 1, the quantum computing component 102 can include a quantum programming component 104 and a post-processing component 106. Aspects of the quantum computing component 102 can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the quantum computing component 102 can also include memory 108 that stores computer executable components and instructions. Furthermore, the quantum computing component 102 can include a processor 110 to facilitate execution of the instructions (e.g., computer executable components and corresponding instructions) by the quantum computing component 102. As shown, the quantum programming component 104, the post-processing component 106, the memory 108 and/or the processor 110 can be electrically and/or communicatively coupled to one another in one or more embodiments.

The quantum computing component 102 (e.g., the quantum programming component 104 of the quantum computing component 102) can receive quantum output data 112. The quantum output data 112 can be generated in response to simulation of one or more quantum circuits. The quantum output data 112 can include, for example, a set of quantum results for one or more quantum circuits. The set of quantum results can be generated in response to simulation of the one or more quantum circuits. A quantum circuit from the one or more quantum circuits can be a machine that performs a set of calculations based on principle of quantum physics. For example, a quantum circuit from the one or more quantum circuits can encode and/or process information using qubits. In an aspect, a quantum circuit from the one or more quantum circuits can be a model for one or more quantum computations associated with a sequence of quantum gates. The quantum output data 112 can be, for example, output from the set of calculations. In one embodiment, a quantum circuit from the one or more quantum circuits can be a hardware quantum processor (e.g., a hardware superconducting quantum processor) that can encode and/or process information using qubits. For instance, a quantum circuit from the one or more quantum circuits can be a hardware quantum processor that executes a set of instruction threads associated with qubits. In an example, the quantum output data 112 can be generated, for example, in response to execution of the set of instruction threads. In another embodiment, a quantum circuit from the one or more quantum circuits can be associated with a quantum simulator that can simulate execution of a set of processing threads on the quantum circuit. For example, in an embodiment, the quantum output data 112 can be generated, for example, in response to simulation of the execution of the set of instruction threads. In certain embodiments, simulation of one or more quantum circuits can be performed based on a machine-readable description of the one or more quantum circuits. For instance, the machine-readable description of the one or more quantum circuits can textually describe one or more qubit gates of the one or more quantum circuits associated with one or more qubits.

The post-processing component 106 can adjust the quantum output data 112 to generate adjusted quantum output data 114. For instance, the post-processing component 106 can adjust the quantum output data 112 based on client system data indicative of information for a client system that consumes the quantum output data 112 and/or the adjusted quantum output data 114. The information for the client system can include, for example, a set of requirements for the client system. For example, the information for the client system can include a set of user requirements for the client system. Additionally or alternatively, the information for the client system can include a set of service requirements for the client system. In an embodiment, the client system can be a computing device with a display such as, for example, a computer, a desktop computer, a laptop computer, a monitor device, a smart device, a smart phone, a mobile device, a handheld device, a tablet device, a wearable device, a virtual reality device, a portable computing device or another type of device associated with a display. Additionally or alternatively, the client system can be associated with an online platform. Additionally or alternatively, the client system can be an online platform associated with a server. In an aspect, the adjusted quantum output data 114 can be streamed to the client system via one or more communication channels. For example, the adjusted quantum output data 114 can be streamed to the client system via a network (e.g., a network device) such as, but not limited to, a wireless network a wired network a local area network (LAN), a wide area network (WAN) such as the Internet, and/or a network that provides interconnections for devices associated with an online environment.

In an embodiment, the post-processing component 106 can generate a plurality of layers of data for the quantum output data 112. For instance, the post-processing component 106 can generate the plurality of layers of data for the quantum output data 112 based on the client system data. The adjusted quantum output data 114 can include the plurality of data for the quantum output data 112, for example. The plurality of layers of data for the quantum output data 112 can be a plurality of data layers with different versions of the quantum output data 112. For example, the post-processing component 106 can generate at least a first version of the quantum output data 112 and a second version of the quantum output data 112. The first version of the quantum output data 112 can be different than the second version of the quantum output data 112. In certain embodiments, the post-processing component 106 can transmit the first version of the quantum output data 112 to the client system prior to the second version of the quantum output data 112. For example, the post-processing component 106 can initially stream the first version of the quantum output data 112 to the client system, and the post-processing component 106 can further stream the second version of the quantum output data 112 to the client system a certain amount of time after the first version of the quantum output data 112 is streamed to the client system. In an implementation, the post-processing component 106 can stream the second version of the quantum output data 112 to the client system (e.g., following the streaming of the first version of the quantum output data 112 to the client system) in response to an indication by the client system that the first version of the quantum output data 112 satisfies a defined criterion associated with a requirement for the client system.

In certain embodiments, the first version of the quantum output data 112 can be associated with a first resolution for the quantum output data 112 and the second version of the quantum output data 112 can be associated with a second resolution for the quantum output data 112. For instance, the post-processing component 106 can generate at least a first layer associated with a first resolution for the quantum output data 112, and a second layer associated with a second resolution for the quantum output data 112. The first resolution associated with the first layer can be different (e.g., a different resolution) than the second resolution associated with the second layer. Furthermore, the post-processing component 106 can transmit the first layer associated with the first resolution for the quantum output data 112 to the client system prior to the second layer associated with the second resolution for the quantum output data 112. In certain embodiments, the post-processing component 106 can adjust streaming of the quantum output data 112 and/or the adjusted quantum output data 114 to the client system. For instance, the post-processing component 106 can adjust streaming of the quantum output data 112 and/or the adjusted quantum output data 114 to the client system based on the client system data. In an aspect, the post-processing component 106 can stop streaming of the adjusted quantum output data 114 to the client system in response to an indication by the client system that the adjusted quantum output data 114 does not satisfy a defined criterion associated with a requirement for the client system. Additionally or alternatively, the post-processing component 106 can adjust the adjusted quantum output data 114 and can stream an updated version of the adjusted quantum output data 114 to the client system in response to an indication by the client system that the adjusted quantum output data 114 does not satisfy a defined criterion associated with a requirement for the client system.

In certain embodiments, the post-processing component 106 can generate the adjusted quantum output data 114 based on classifications, correlations, inferences and/or expressions associated with principles of artificial intelligence. For instance, the post-processing component 106 can employ an automatic classification system and/or an automatic classification process to determine the adjusted quantum output data 114. In one example, the post-processing component 106 can employ a probabilistic and/or statistical-based analysis (e.g., factoring into the analysis utilities and costs) to learn and/or generate inferences with respect to the quantum output data 112. In an aspect, the post-processing component 106 can include an inference component (not shown) that can further enhance aspects of the post-processing component 106 utilizing in part inference-based schemes to facilitate learning and/or generating inferences associated with the quantum output data 112. The post-processing component 106 can employ any suitable machine-learning based techniques, statistical-based techniques and/or probabilistic-based techniques. For example, the post-processing component 106 can employ expert systems, fuzzy logic, SVMs, Hidden Markov Models (HMMs), greedy search algorithms, rule-based systems, Bayesian models (e.g., Bayesian networks), neural networks, other non-linear training techniques, data fusion, utility-based analytical systems, systems employing Bayesian models, etc. In another aspect, the post-processing component 106 can perform a set of machine learning computations associated with generation of the adjusted quantum output data 114. For example, the post-processing component 106 can perform a set of clustering machine learning computations, a set of logistic regression machine learning computations, a set of decision tree machine learning computations, a set of random forest machine learning computations, a set of regression tree machine learning computations, a set of least square machine learning computations, a set of instance-based machine learning computations, a set of regression machine learning computations, a set of support vector regression machine learning computations, a set of k-means machine learning computations, a set of spectral clustering machine learning computations, a set of rule learning machine learning computations, a set of Bayesian machine learning computations, a set of deep Boltzmann machine computations, a set of deep belief network computations, and/or a set of different machine learning computations to generate the adjusted quantum output data 114.

It is to be appreciated that the quantum computing component 102 (e.g., the quantum programming component 104 and/or the post-processing component 106) performs a quantum computing process and/or a quantum post-process process that cannot be performed by a human (e.g., is greater than the capability of a single human mind). For example, an amount of data processed, a speed of data processed and/or data types of data processed by the quantum computing component 102 (e.g., the quantum programming component 104 and/or the post-processing component 106) over a certain period of time can be greater, faster and different than an amount, a speed and data types that can be processed by a single human mind over the same period of time. The quantum computing component 102 (e.g., the quantum programming component 104 and/or the post-processing component 106) can also be fully operational towards performing one or more other functions (e.g., fully powered on, fully executed, etc.) while also performing the above-referenced quantum computing process and/or quantum post-process process. Additionally, the quantum output data 112 received by the quantum computing component 102 (e.g., the quantum programming component 104 and/or the post-processing component 106) can include information that is impossible to obtain manually by a user. For example, a type of information included in the quantum output data 112, a variety of information included in the quantum output data 112, and/or an amount of information included in the quantum output data 112 can be more complex than information obtained manually by a user. Moreover, the adjusted quantum output data 114 generated by the quantum computing component 102 (e.g., the quantum programming component 104 and/or the post-processing component 106) can include information that is impossible to obtain manually by a user. For example, a type of information included in the adjusted quantum output data 114, a variety of information included in the adjusted quantum output data 114, and/or an amount of information included in the adjusted quantum output data 114 can be more complex than information obtained manually by a user.

Additionally, it is to be appreciated that the system 100 can provide various advantages as compared to conventional quantum computing systems. For instance, accuracy of simulation of a quantum circuit and/or efficiency of simulation of a quantum circuit can be improved by employing the system 100. Furthermore, an amount of time to perform a quantum computing process, an amount of processing performed by a quantum computing process, and/or an amount of storage utilized by a quantum computing process can be reduced by employing the system 100. Moreover, performance a quantum circuit can be improved by employing the system 100, efficiency of a quantum circuit can be improved by employing the system 100, and/or another characteristic of a quantum circuit can be improved by employing the system 100.

Figure 2:
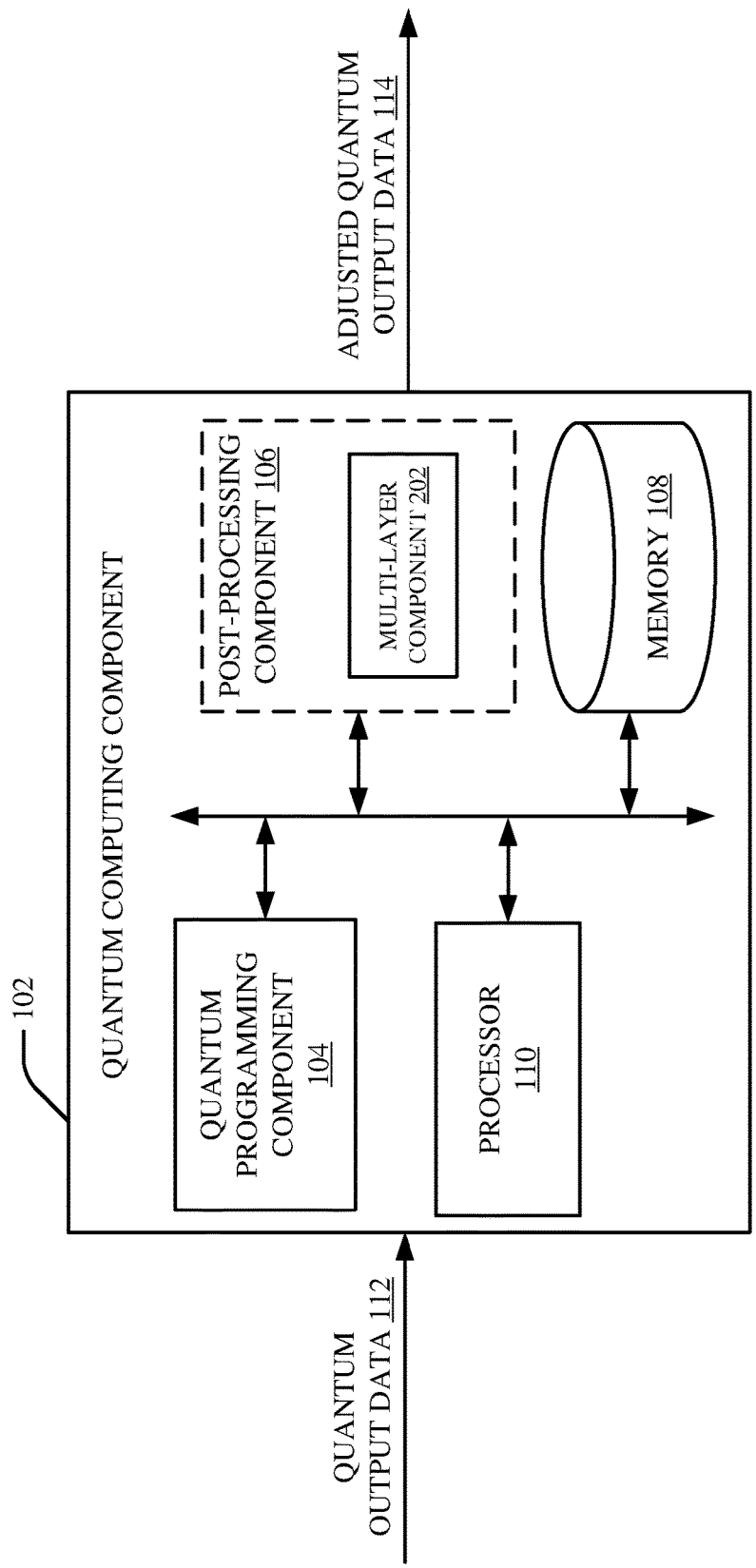
FIG. 2 illustrates a block diagram of another example, non-limiting system that includes a quantum computing component in accordance with one or more embodiments described herein.

FIG. 2 illustrates a block diagram of an example, non-limiting system 200 in accordance with one or more embodiments described herein. Repetitive description of like elements employed in other embodiments described herein is omitted for sake of brevity.

The system 200 includes the quantum computing component 102. The quantum computing component 102 can include the quantum programming component 104, the post-processing component 106, the memory 108 and/or the processor 110. In the embodiment shown in FIG. 2, the post-processing component 106 can include a multi-layer component 202. The multi-layer component 202 can generate different layers of data for the quantum output data 112. For instance, the multi-layer component 202 can generate different layers of data for the quantum output data 112 based on the client system data. The different layers of data can be, for example, multi-layer results associated with the quantum output data 112. In an aspect, the multi-layer component 202 can adjust the quantum output data 112 based on analysis of the set of requirements for the client system (e.g., the one or more user requirements and/or the one or more service requirements) to generate the adjusted quantum output data 114. In another embodiment, the multi-layer component 202 can generate multi-resolution results associated with the quantum output data 112. For instance, the multi-layer component 202 can generate different representations (e.g., different data layers) of the quantum output data 112 with different resolutions. In an implementation, the multi-layer component 202 can generate a high-resolution version of at least a portion of the quantum output data 112. The multi-layer component 202 can also generate one or more different versions of the portion of the quantum output data 112 with less resolution than the high-resolution version. The high-resolution version and the one or more different versions of the portion of the quantum output data 112 can be provided to the client system. In an aspect, a low-resolution version of the portion of the quantum output data 112 can be initially provided to the client system. Furthermore, the multi-layer component 202 can the provide a more detailed version (e.g., higher resolution versions) of the portion of the quantum output data 112 to the client system. In certain embodiments, the multi-layer component 202 can generate the different representations of the quantum output data 112 with the different resolutions based on one or more specifications associated with the quantum circuit. The one or more specifications associated with the quantum circuit can include pulse data associated with the quantum circuit, a number of counts associated with the quantum circuit, and/or another specification associated with the quantum circuit. In certain embodiments, the multi-layer component 202 can employ output from a particular detailed version of the quantum output data 112 as input to generate another detailed version of the quantum output data 112.

In certain embodiments, the multi-layer component 202 can generate a plurality of layers of data for the quantum output data 112. For instance, the multi-layer component 202 can generate the plurality of layers of data for the quantum output data 112 based on the client system data. The adjusted quantum output data 114 can include the plurality of layers of data for the quantum output data 112, for example. The plurality of layers of data for the quantum output data 112 can be a plurality of data layers with different versions of the quantum output data 112. For example, the multi-layer component 202 can generate at least a first version of the quantum output data 112 and a second version of the quantum output data 112. The first version of the quantum output data 112 can be different than the second version of the quantum output data 112. In certain embodiments, the multi-layer component 202 can transmit the first version of the quantum output data 112 to the client system prior to the second version of the quantum output data 112. For example, the multi-layer component 202 can initially stream the first version of the quantum output data 112 to the client system, and the multi-layer component 202 can further stream the second version of the quantum output data 112 to the client system a certain amount of time after the first version of the quantum output data 112 is streamed to the client system. In an implementation, the multi-layer component 202 can stream the second version of the quantum output data 112 to the client system (e.g., following the streaming of the first version of the quantum output data 112 to the client system) in response to an indication by the client system that the first version of the quantum output data 112 satisfies a defined criterion associated with a requirement for the client system. In certain embodiments, the first version of the quantum output data 112 can be associated with a first resolution for the quantum output data 112 and the second version of the quantum output data 112 can be associated with a second resolution for the quantum output data 112. For instance, the multi-layer component 202 can generate at least a first layer associated with a first resolution for the quantum output data 112, and a second layer associated with a second resolution for the quantum output data 112. The first resolution associated with the first layer can be different (e.g., a different resolution) than the second resolution associated with the second layer. Furthermore, the multi-layer component 202 can transmit the first layer associated with the first resolution for the quantum output data 112 to the client system prior to the second layer associated with the second resolution for the quantum output data 112.

Figure 3:
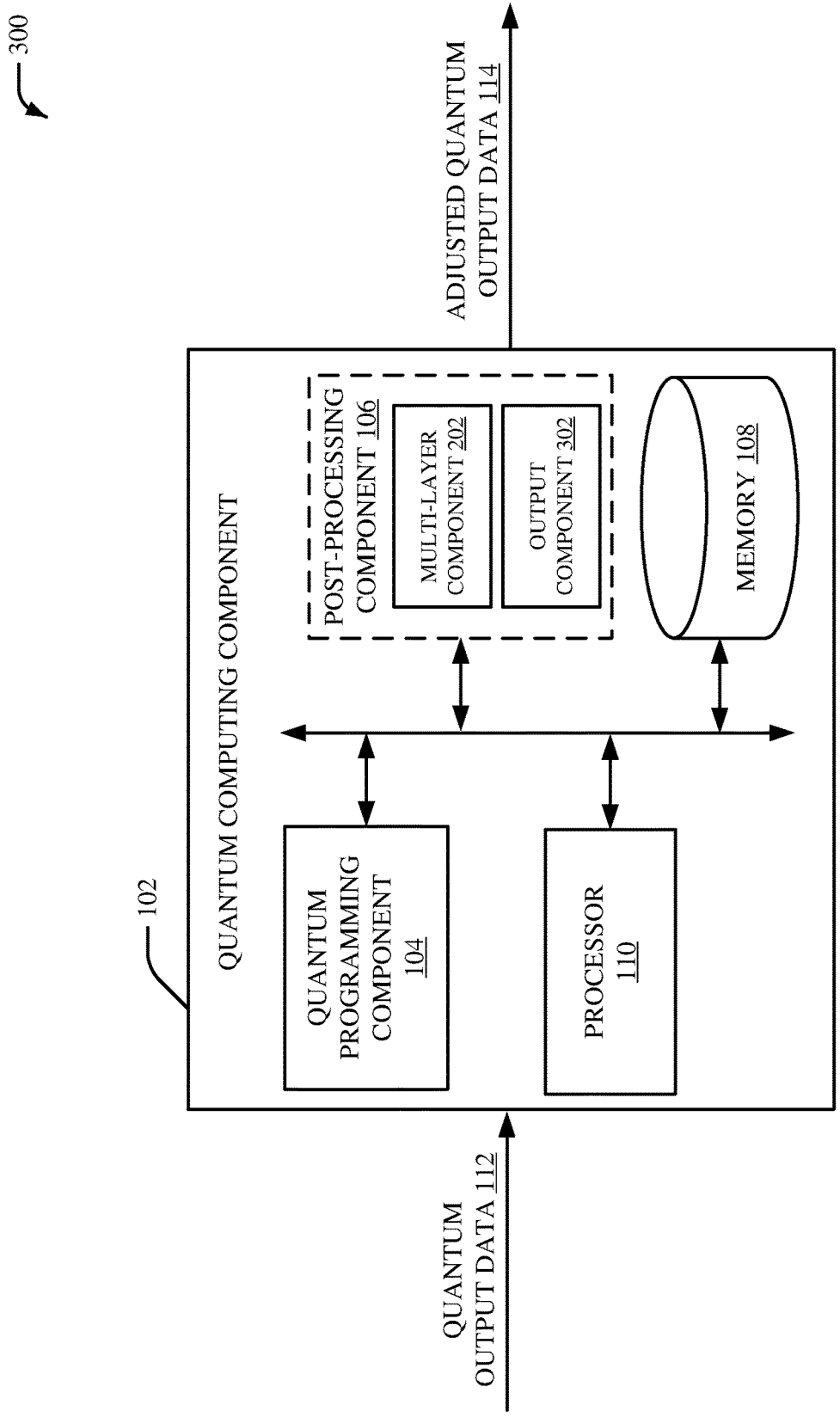
FIG. 3 illustrates a block diagram of yet another example, non-limiting system that includes a quantum computing component in accordance with one or more embodiments described herein.

FIG. 3 illustrates a block diagram of an example, non-limiting system 300 in accordance with one or more embodiments described herein. Repetitive description of like elements employed in other embodiments described herein is omitted for sake of brevity.

The system 300 includes the quantum computing component 102. The quantum computing component 102 can include the quantum programming component 104, the post-processing component 106, the memory 108 and/or the processor 110. In the embodiment shown in FIG. 3, the post-processing component 106 can include the multi-layer component 202 and/or an output component 302. The output component 302 can transmit the adjusted quantum output data 114 to the client system. For instance, the output component 302 can manage streaming of the adjusted quantum output data 114 to the client system. In an embodiment, the output component 302 can adjust the quantum output data 112 and/or the adjusted quantum output data 114 provided to the client system. For instance, the output component 302 can adjust streaming of the quantum output data 112 and/or the adjusted quantum output data 114 to the client system. In an aspect, the output component 302 can adjust streaming of the quantum output data 112 and/or the adjusted quantum output data 114 to the client system based on the client system data. In another aspect, the output component 302 can stop streaming of the quantum output data 112 and/or the adjusted quantum output data 114 to the client system in response to an indication by the client system that the quantum output data 112 and/or the adjusted quantum output data 114 does not satisfy a defined criterion associated with a requirement for the client system. Additionally or alternatively, the output component 302 can adjust the quantum output data 112 and/or the adjusted quantum output data 114 by streaming an updated version of the quantum output data 112 and/or the adjusted quantum output data 114 to the client system in response to an indication by the client system that the quantum output data 112 and/or the adjusted quantum output data 114 does not satisfy a defined criterion associated with a requirement for the client system.

Figure 4:
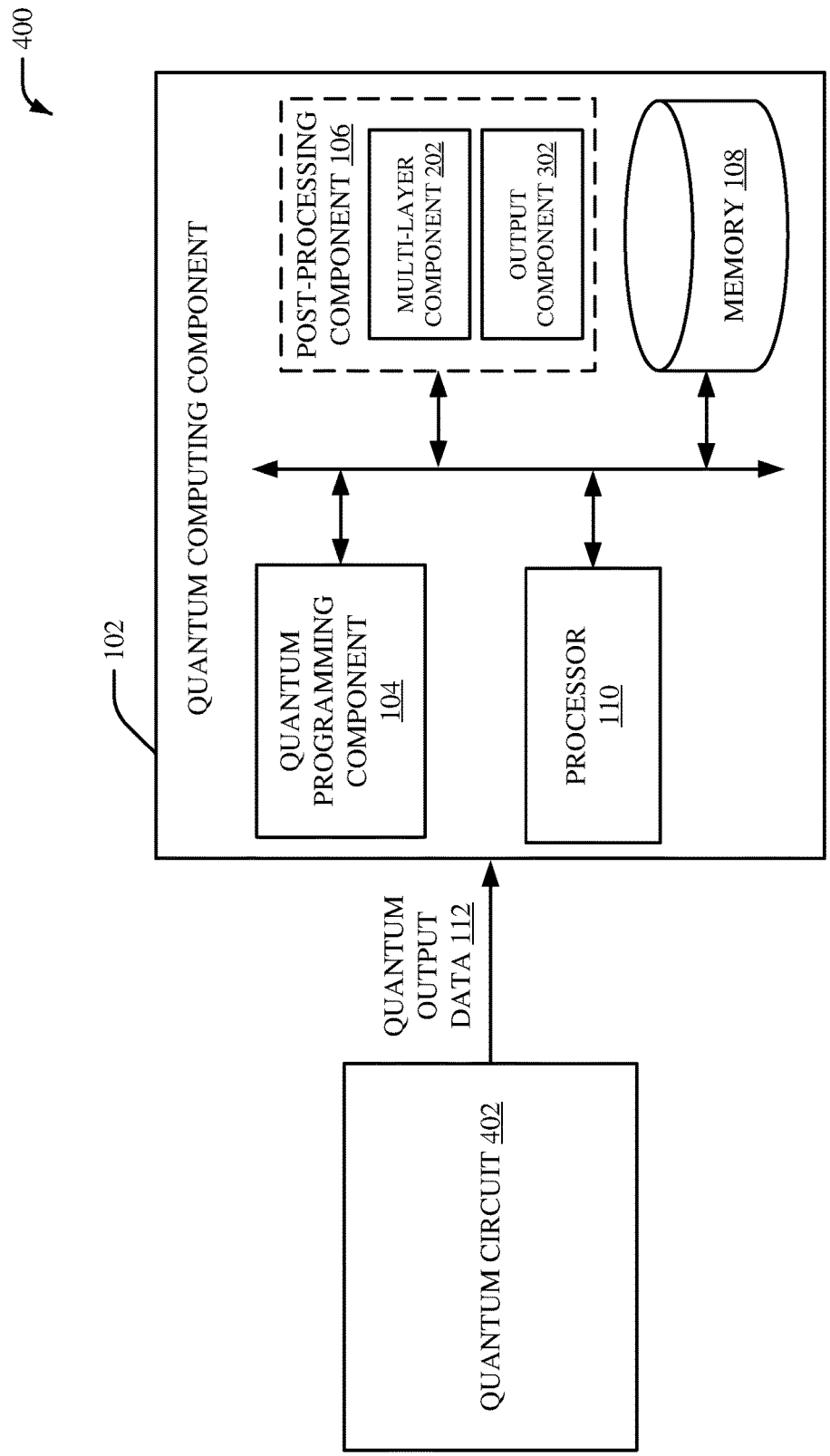
FIG. 4 illustrates an example, non-limiting system that includes a quantum computing component and a quantum circuit in accordance with one or more embodiments described herein.

FIG. 4 illustrates a block diagram of an example, non-limiting system 400 in accordance with one or more embodiments described herein. Repetitive description of like elements employed in other embodiments described herein is omitted for sake of brevity.

The system 400 includes the quantum computing component 102 and a quantum circuit 402. The quantum computing component 102 can include the quantum programming component 104, the post-processing component 106, the memory 108 and/or the processor 110. The post-processing component 106 can include the multi-layer component 202 and/or the output component 302. The quantum circuit 402 can provide the quantum output data 112 to the quantum computing component 102. For instance, the quantum circuit 402 can generate the quantum output data 112 and can provide the quantum output data 112 to the quantum computing component 102 for analysis and/or adjustment. The quantum circuit 402 can be a machine that performs a set of calculations based on principle of quantum physics. For example, the quantum circuit 402 can encode and/or process information using qubits. In one embodiment, the quantum circuit 402 can be a hardware quantum processor (e.g., a hardware superconducting quantum processor) that can encode and/or process information using qubits. For example, the quantum circuit 402 can be a hardware quantum processor that executes a set of instruction threads associated with qubits. In certain embodiments, the quantum output data 112 can be generated based on the set of calculations performed by the quantum circuit 402. Additionally or alternatively, the set of instruction threads executed by the quantum circuit 402. In certain embodiments, the quantum circuit 402 can be a quantum simulator that can simulate execution of a set of processing threads on a quantum circuit. In certain embodiments, simulation of the quantum circuit 402 can be performed based on a machine-readable description of the quantum circuit 402. For instance, the machine-readable description of the quantum circuit 402 can textually describe one or more qubit gates of the quantum circuit 402 associated with one or more qubits.

Figure 5:
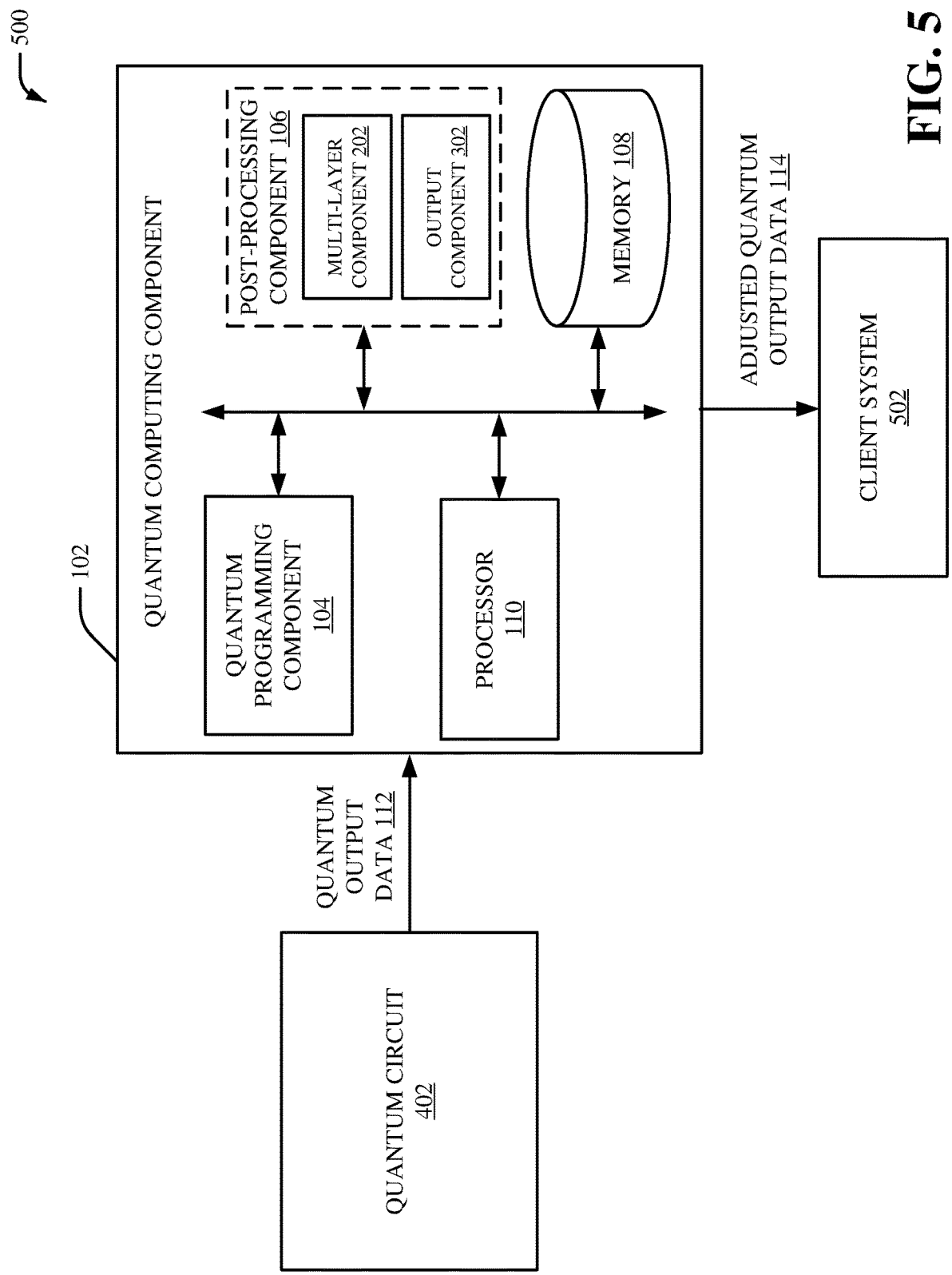
FIG. 5 illustrates an example, non-limiting system that includes a quantum computing component, a quantum circuit and a client system in accordance with one or more embodiments described herein.

FIG. 5 illustrates a block diagram of an example, non-limiting system 500 in accordance with one or more embodiments described herein. Repetitive description of like elements employed in other embodiments described herein is omitted for sake of brevity.

The system 500 includes the quantum computing component 102, the quantum circuit 402 and/or a client system 502. The quantum computing component 102 can include the quantum programming component 104, the post-processing component 106, the memory 108 and/or the processor 110. The post-processing component 106 can include the multi-layer component 202 and/or the output component 302. The quantum computing component 102 (e.g., the output component 302) can transmit the adjusted quantum output data 114 to the client system 502. Furthermore, the client system 502 can consume and/or employ the adjusted quantum output data 114. In an embodiment, the client system 502 can be a computing device with a display such as, for example, a computer, a desktop computer, a laptop computer, a monitor device, a smart device, a smart phone, a mobile device, a handheld device, a tablet device, a wearable device, a virtual reality device, a portable computing device or another type of device associated with a display. Additionally or alternatively, the client system 502 can be associated with an online platform. For example, the client system 502 can be communicatively coupled to the quantum computing component 102 via a network. The adjusted quantum output data 114 can be streamed to the client system 502 via one or more communication channels. Furthermore, the client system 502 can provide a graphical user interface to present the adjusted quantum output data 114 in a human-interpretable format. Additionally or alternatively, the client system 502 can be an online platform associated with a server. For instance, the client system 502 can be implemented as a server. In certain embodiments, the quantum computing component 102 can additionally or alternatively be implemented on the server. For instance, in certain embodiments, the quantum computing component 102 can additionally or alternatively be in communicatively coupled to the quantum circuit 402 via a network. A network can be a wireless network a wired network a LAN, a WAN such as the Internet, a network that provides interconnections for devices associated with an online environment, and/or another type of network. In certain embodiments, the client system data can be indicative of information for the client system 502. The information for the client system 502 can include, for example, a set of requirements for the client system 502. For example, the information for the client system 502 can include a set of user requirements for the client system 502. Additionally or alternatively, the information for the client system 502 can include a set of service requirements for the client system 502.

Figure 6:
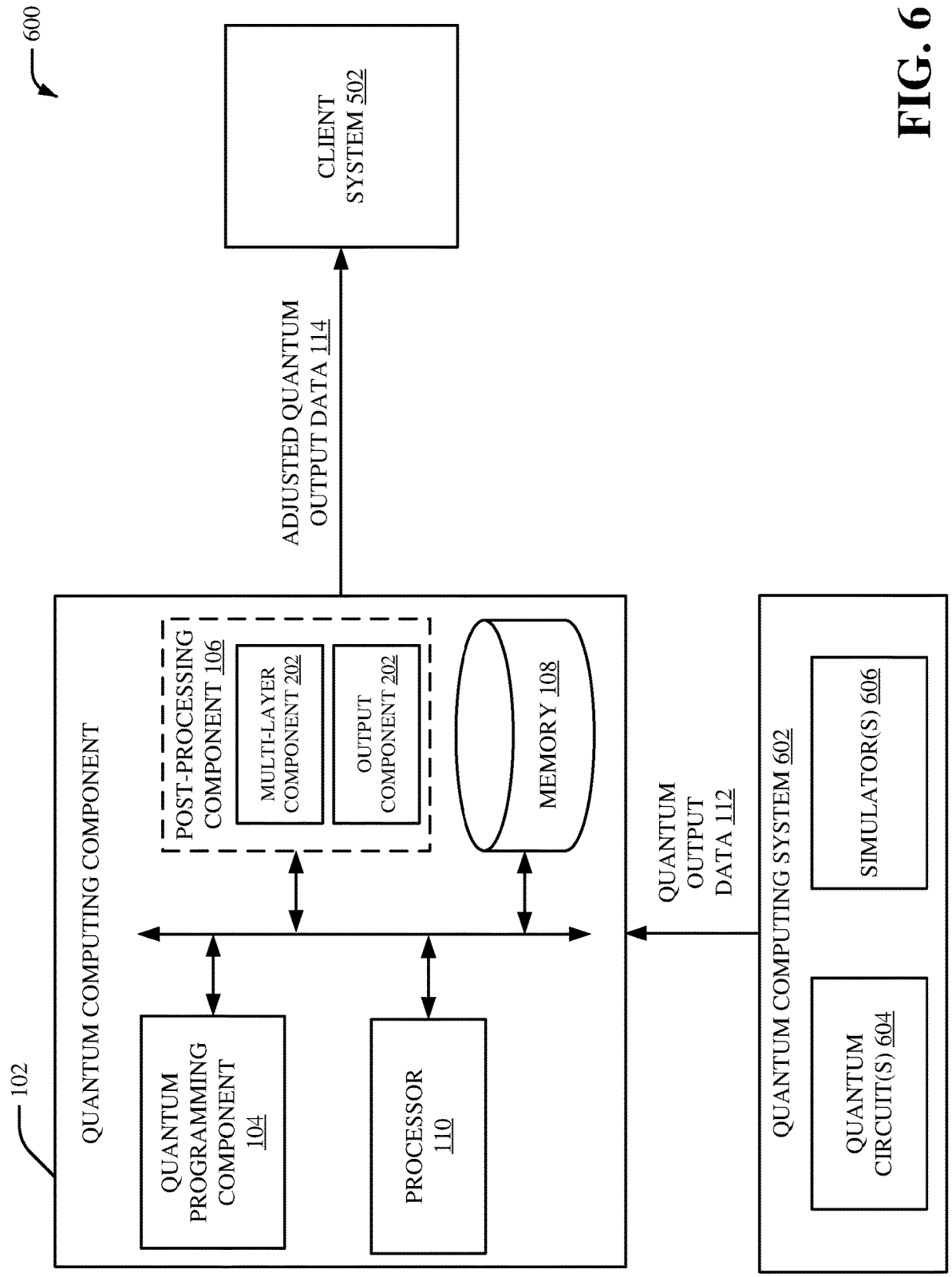
FIG. 6 illustrates an example, non-limiting system that includes a quantum computing component, a quantum computing system and a client system in accordance with one or more embodiments described herein.

FIG. 6 illustrates a block diagram of an example, non-limiting system 600 in accordance with one or more embodiments described herein. Repetitive description of like elements employed in other embodiments described herein is omitted for sake of brevity.

The system 600 includes the quantum computing component 102, the client system 502, and/or a quantum computing system 602. The quantum computing component 102 can include the quantum programming component 104, the post-processing component 106, the memory 108 and/or the processor 110. The post-processing component 106 can include the multi-layer component 202 and/or the output component 302. The quantum computing system 602 can provide the quantum output data 112 to the quantum computing component 102. Furthermore, the quantum computing component 102 (e.g., the output component 302) can transmit the adjusted quantum output data 114 to the client system 502. The quantum computing system 602 can include one or more quantum circuits 604 and/or one or more simulators 606. In an embodiment, the quantum circuit 402 can correspond to the one or more quantum circuits 604. The one or more quantum circuits 604 and/or the one or more simulators 606 can generate the quantum output data 112. The one or more quantum circuits 604 can be one or more machines that perform a set of calculations based on principle of quantum physics. For example, the one or more quantum circuits 604 can encode and/or process information using qubits. In one embodiment, the one or more quantum circuits 604 can be one or more hardware quantum processors (e.g., one or more hardware superconducting quantum processors) that can run encode and/or process information using qubits. For example, the one or more quantum circuits 604 can be one or more hardware quantum processors that execute a set of instruction threads associated with qubits. The one or more simulators 606 can perform one or more simulations of the one or more quantum circuits 604. In certain embodiments, the one or more simulators 606 can be one or more quantum simulators that simulate execution of a set of processing threads on the one or more quantum circuits 604. In certain embodiments, the one or more simulators 606 can simulate the one or more quantum circuits 604 based on a machine-readable description of the one or more quantum circuits 604. For instance, the machine-readable description of the one or more quantum circuits 604 can textually describe one or more qubit gates of the one or more quantum circuits 604 associated with one or more qubits. In certain embodiments, the one or more simulators 606 can perform one or more simulations of the one or more quantum circuits 604 via wavefunction evolution indicative of a quantum model that describes changes and/or quantum effects of the one or more quantum circuits 604 over a defined time interval. In certain embodiments, the one or more simulators 606 can perform a stochastic simulation process (e.g., a quantum circuit simulation process) associated with the one or more quantum circuits 604.

Figure 7:
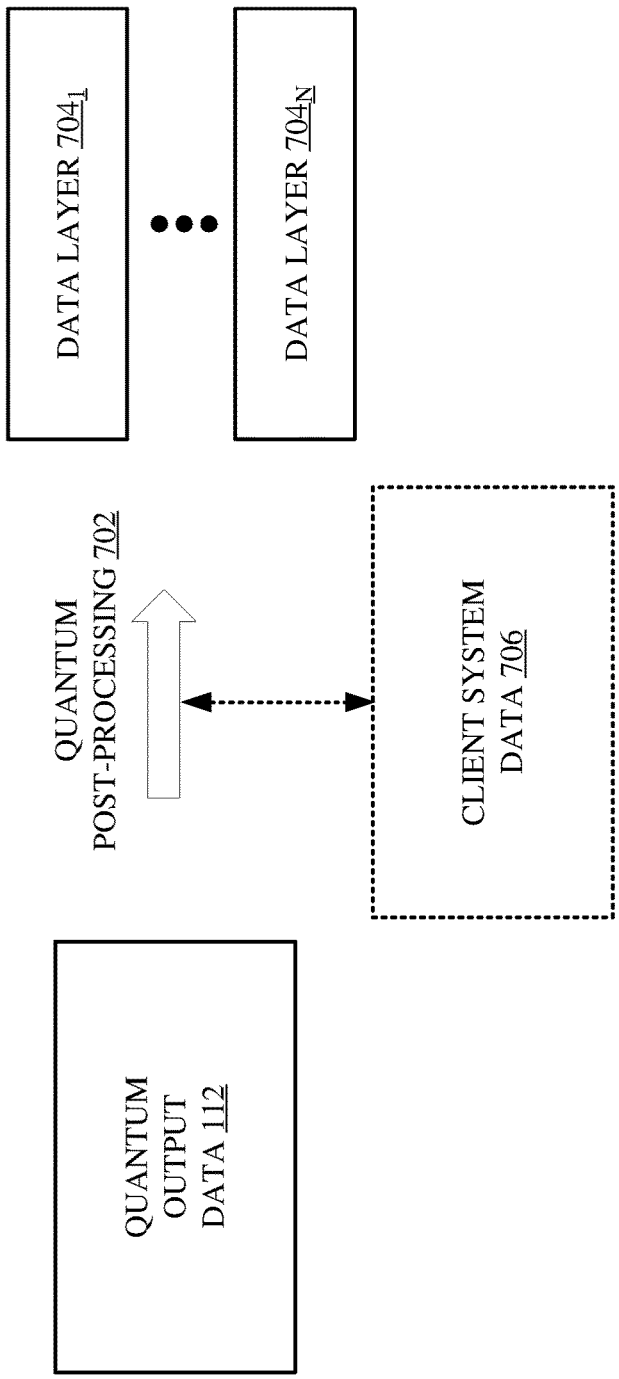
FIG. 7 illustrates an example, non-limiting system associated with quantum data post-processing in accordance with one or more embodiments described herein.

FIG. 7 illustrates a block diagram of an example, non-limiting system 700 in accordance with one or more embodiments described herein. Repetitive description of like elements employed in other embodiments described herein is omitted for sake of brevity.

The system 700 includes quantum post-processing 702. The quantum post-processing 702 can be a process performed by the quantum computing component 102 (e.g., the quantum programming component 104 and/or the post-processing component 106). In an aspect, the quantum post-processing 702 can transform the quantum output data 112 into a set of data layers $704_{1-N}$, where N is an integer. The quantum output data 112 can be generated in response to simulation of one or more quantum circuits (e.g., the quantum circuit 402 and/or the one or more quantum circuits 604). The quantum output data 112 can include, for example, a set of quantum results for the one or more quantum circuits. In an embodiment, the set of quantum results associated with the quantum output data 112 can be generated in response to simulation of the one or more quantum circuits. In one example, the quantum output data 112 can be output from a set of calculations performed by the one or more quantum circuits. In another example, the quantum output data 112 can be generated in response to execution of a set of instruction threads by the one or more quantum circuits. The set of data layers $704_{1-N}$ can be a plurality of layers of data for the quantum output data 112 with different versions of the quantum output data 112. For example, the data layer $704_1$ can be a first version of the quantum output data 112, the data layer $704_N$ can be a second version of the quantum output data 112, etc. Furthermore, the data layer $704_1$ can include different data than the data layer $704_N$. For example, the first version of the quantum output data 112 associated with the data layer $704_1$ can be different than the second version of the quantum output data 112 associated with the data layer $704_N$. In certain embodiments, the data layer $704_1$ can be associated with a first program executed by the one or more quantum circuits, the data layer $704_N$ can be associated with a second program executed by the one or more quantum circuits, etc. In certain embodiments, the data layer $704_1$ can be associated with a first simulation run executed by the one or more quantum circuits, the data layer $704_N$ can be associated with a second simulation run executed by the one or more quantum circuits, etc. In certain embodiments, set of data layers $704_{1-N}$ can include different resolutions for the quantum output data 112. For example, the data layer $704_1$ can be associated with a first resolution for the quantum output data 112, the data layer $704_N$ can be associated with a second resolution for the quantum output data 112. The first resolution associated with the data layer $704_1$ can be different (e.g., a different resolution) than the second resolution associated with the data layer $704_N$. In certain embodiments, the adjusted quantum output data 114 can include the set of data layers $704_{1-N}$.

In an embodiment, the quantum post-processing 702 can transform the quantum output data 112 into the set of data layers $704_{1-N}$ based on client system data 706. The client system data 706 can include information for a client system (e.g., the client system 502) that consumes the set of data layers $704_{1-N}$. For example, the client system data 706 can include information associated with a set of requirements for the client system. In certain embodiments, the client system data 706 can include information associated with a set of user requirements for the client system. For instance, a user (e.g., a user identity) associated with the client system can provide one or more predefined user requirements and/or one or more predefined user preferences. A user (e.g., a user identity) associated with the client system can additionally or alternatively provide feedback in response to receiving at least a portion of the set of data layers $704_{1-N}$. Additionally or alternatively, the client system data 706 can include information associated with a set of service requirements for the client system. For instance, the client system data 706 can include information to facilitate consumption of the set of data layers $704_{1-N}$ by the client system. In another example, the client system data 706 can include information associated with one or more jobs and/or one or more tasks to be performed by the client system.

Figure 8:
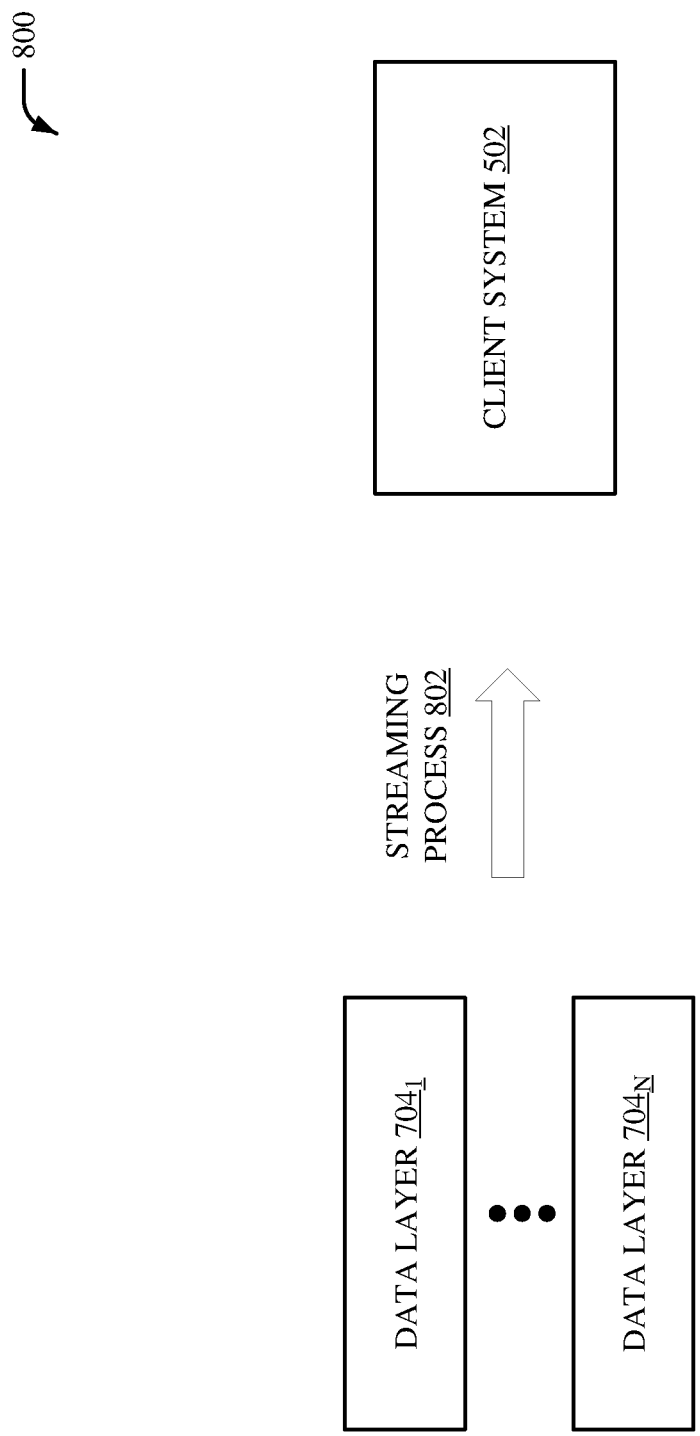
FIG. 8 illustrates another example, non-limiting system associated with quantum data post-processing in accordance with one or more embodiments described herein.

FIG. 8 illustrates a block diagram of an example, non-limiting system 800 in accordance with one or more embodiments described herein. Repetitive description of like elements employed in other embodiments described herein is omitted for sake of brevity.

The system 800 includes a streaming processing 802. The streaming process 802 can be a process performed by the quantum computing component 102 (e.g., the output component 302). In an aspect, the streaming process 802 can stream at least a portion of the set of data layers $704_{1-N}$ to the client system 502. For instance, the streaming processing 802 can manage streaming of at least a portion of the set of data layers $704_{1-N}$ to the client system 502. In another aspect, the streaming process 802 can transmit respective data layers from the set of data layers $704_{1-N}$ to the client system 502 in approximate real-time after the respective data layers are generated. For example, the streaming process 802 can transmit the data layer $704_1$ to the client system 502 in approximate real-time after the data layer $704_1$ is generated, the streaming process 802 can transmit the data layer $704_N$ in approximate real-time after the data layer $704_N$ is generated and after the data layer $704_1$ is transmitted to the client system 502, etc. In an embodiment, the streaming processing 802 can adjust streaming of the set of data layers $704_{1-N}$ provided to the client system 502. In certain embodiments, the streaming processing 802 can adjust streaming of the set of data layers $704_{1-N}$ to the client system 502 based on the client system data 706. In another aspect, the streaming processing 802 can stop streaming of at least a portion of the set of data layers $704_{1-N}$ to the client system 502 in response to an indication by the client system 502 that at least a portion of the set of data layers $704_{1-N}$ does not satisfy a defined criterion associated with a requirement for the client system 502. Additionally or alternatively, the streaming process 802 can adjust the set of data layers $704_{1-N}$ by streaming an updated version of the set of data layers $704_{1-N}$ to the client system 502 in response to an indication by the client system 502 that at least a portion of the set of data layers $704_{1-N}$ does not satisfy a defined criterion associated with a requirement for the client system 502. In certain embodiments, a user (e.g., a user identity) associated with the client system 502 can indicate that a particular data layer from the set of data layers $704_{1-N}$ does not satisfy a defined criterion for a job performed by the client system 502. As such, the streaming process 802 can be interrupted by the client system 502. In certain embodiments, the quantum post-processing 702 can be re-initiated and/or a quantum computing process associated with the one or more quantum circuits can be re-initiated in response to a determination that at least a portion of the set of data layers $704_{1-N}$ does not satisfy a defined criterion associated with a requirement for the client system 502.

Figure 9:
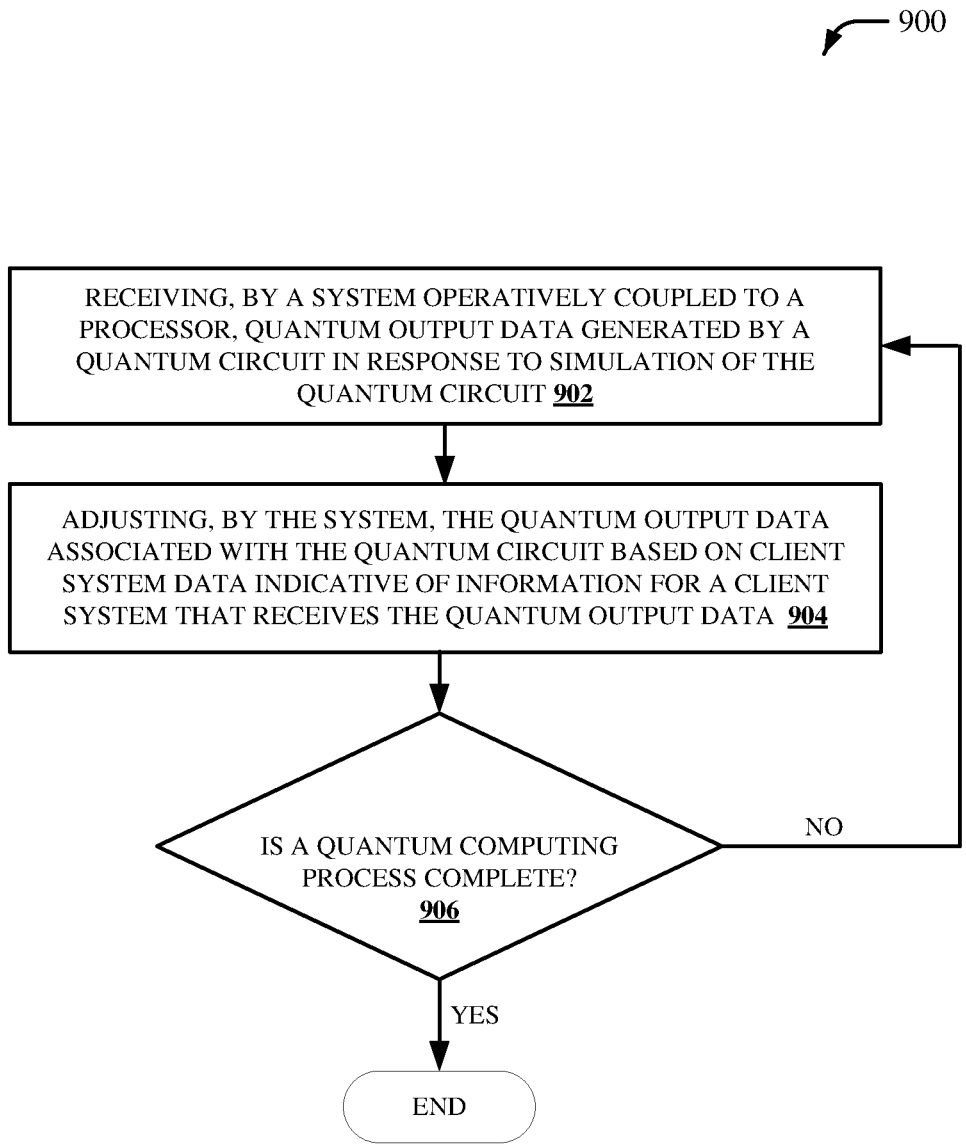
FIG. 9 illustrates a flow diagram of an example, non-limiting computer-implemented method for providing quantum data post-processing in accordance with one or more embodiments described herein.

FIG. 9 illustrates a flow diagram of an example, non-limiting computer-implemented method 900 for providing quantum data post-processing in accordance with one or more embodiments described herein. At 902, quantum output data generated by a quantum circuit is received, by a system operatively coupled to a processor (e.g., by quantum programming component 104), in response to simulation of the quantum circuit. For instance, the quantum output data can include a set of quantum results in response to simulation of the quantum circuit. The quantum circuit can be a machine that performs a set of calculations based on principle of quantum physics. For example, the quantum circuit can encode and/or process information using qubits. In an aspect, the quantum circuit can be a model for one or more quantum computations associated with a sequence of quantum gates. The quantum output data can be, for example, output from the set of calculations. In one embodiment, the quantum circuit can be a hardware quantum processor (e.g., a hardware superconducting quantum processor) that can encode and/or process information using qubits. For instance, the quantum circuit can be a hardware quantum processor that executes a set of instruction threads associated with qubits. In an example, the quantum output data can be generated, for example, in response to execution of the set of instruction threads. In another embodiment, the quantum circuit can be associated with a quantum simulator that can simulate execution of a set of processing threads on the quantum circuit. For example, in an embodiment, the quantum output data can be generated in response to simulation of the execution of the set of instruction threads. In certain embodiments, simulation of the quantum circuit can be performed based on a machine-readable description of the quantum circuit. For instance, the machine-readable description of the quantum circuit can textually describe one or more qubit gates of the quantum circuit associated with one or more qubits.

At 904, the quantum output data associated with the quantum circuit is adjusted, by the system (e.g., by post-processing component 106), based on client system data indicative of information for a client system that receives the quantum output data. The information for the client system can include, for example, a set of requirements for the client system. For example, the information for the client system can include a set of user requirements for the client system. Additionally or alternatively, the information for the client system can include a set of service requirements for the client system. In an embodiment, the client system can be a computing device with a display such as, for example, a computer, a desktop computer, a laptop computer, a monitor device, a smart device, a smart phone, a mobile device, a handheld device, a tablet device, a wearable device, a virtual reality device, a portable computing device or another type of device associated with a display. Additionally or alternatively, the client system can be associated with an online platform. Additionally or alternatively, the client system can be an online platform associated with a server. In an aspect, adjusted quantum output data can be streamed to the client system via one or more communication channels. For example, adjusted quantum output data can be streamed to the client system via a network (e.g., a network device) such as, but not limited to, a wireless network a wired network a LAN, WAN such as the Internet, and/or a network that provides interconnections for devices associated with an online environment.

In an embodiment, a plurality of layers of data for the quantum output data can be generated. For instance, the plurality of layers of data for the quantum output data can be generated based on the client system data. The adjusted quantum output data can include the plurality of data for the quantum output data, for example. The plurality of layers of data for the quantum output data can be a plurality of data layers with different versions of the quantum output data. For example, at least a first version of the quantum output data and a second version of the quantum output data can be generated. The first version of the quantum output data can be different than the second version of the quantum output data. In certain embodiments, the first version of the quantum output data can be transmitted to the client system prior to the second version of the quantum output data. In certain embodiments, the first version of the quantum output data can be associated with a first resolution for the quantum output data and the second version of the quantum output data can be associated with a second resolution for the quantum output data 112. For instance, at least a first layer associated with a first resolution for the quantum output data, and a second layer associated with a second resolution for the quantum output data, can be generated. The first resolution associated with the first layer can be different (e.g., a different resolution) than the second resolution associated with the second layer. Furthermore, the first layer associated with the first resolution for the quantum output data can be transmitted to the client system prior to the second layer associated with the second resolution for the quantum output data. In certain embodiments, streaming of the quantum output data to the client system can be adjusted. In certain embodiments, streaming of the quantum output data to the client system can be stopped and/or re-initiated in response to an indication by the client system that the adjusted quantum output data does not satisfy a defined criterion associated with a requirement for the client system. Additionally or alternatively, an updated version of the quantum output data can be streamed to the client system in response to an indication by the client system that the quantum output data received by the client system does not satisfy a defined criterion associated with a requirement for the client system. In certain embodiments, the adjusting the quantum output data comprises improving performance of the quantum circuit.

At 906, it is determined whether a quantum computing process is complete. For example, it can be determined if the quantum circuit is finished generating quantum output data and/or if a simulation associated with the quantum circuit is complete. If no, the computer-implemented method 900 returns to 902. If yes, the computer-implemented method 900 ends.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Moreover, because at least receiving quantum output data, adjusting quantum output data, etc. are established from a combination of electrical and mechanical components and circuitry, a human is unable to replicate or perform processing performed by the quantum computing component 102 (e.g., the quantum programming component 104, the post-processing component 106, the multi-layer component 202, and/or the output component 302) disclosed herein. For example, a human is unable to perform a quantum computing process, quantum post-processing, a streaming process for quantum output data, etc.

Figure 10:
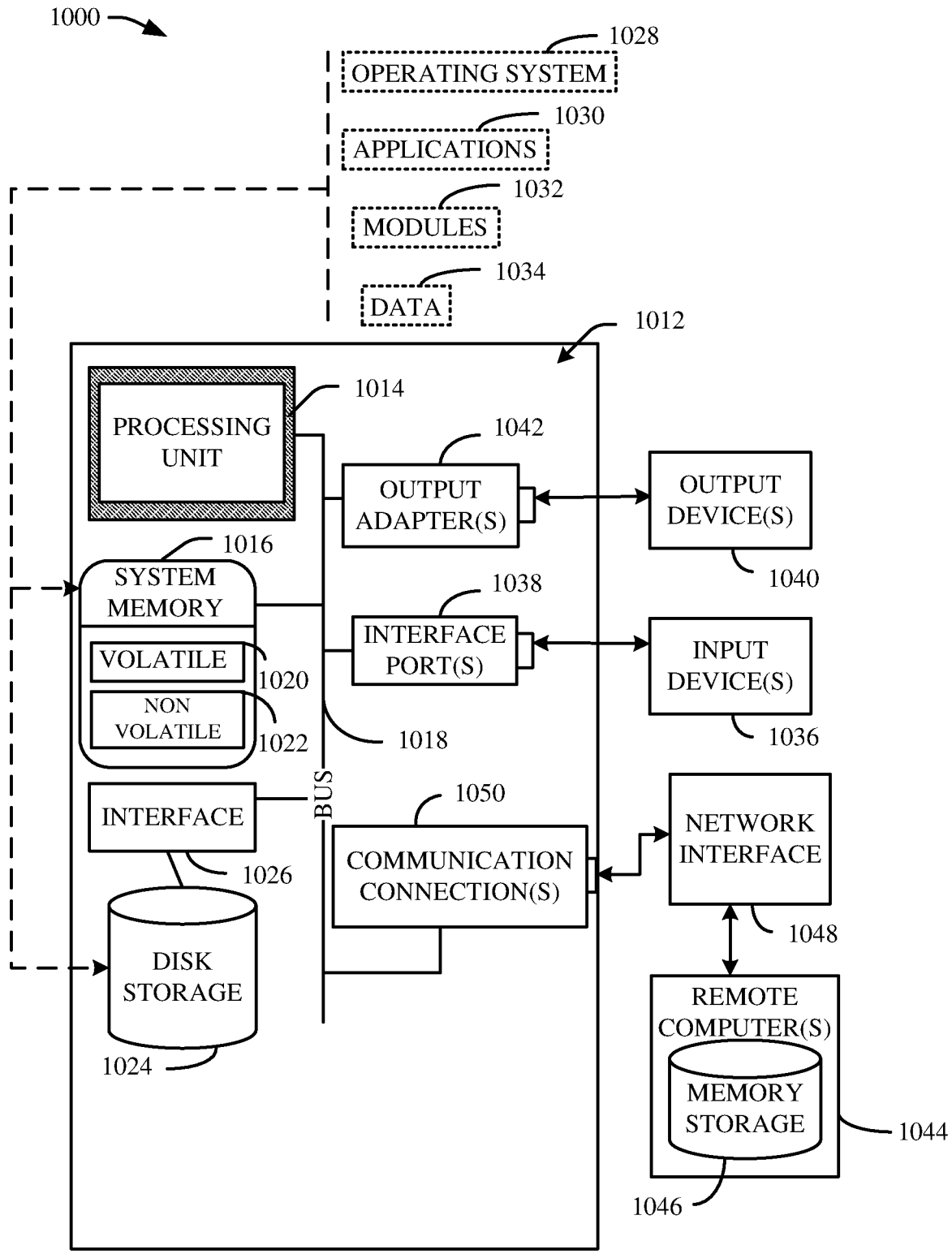
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity.

With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. Computer 1012 can also include removable/non-removable, volatile/non-volatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media. To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012.

System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/ software employed to connect the network interface 1048 to the system bus 1018. While communication connection 1050 is shown for illustrative clarity inside computer 1012, it can also be external to computer 1012. The hardware/ software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
    a memory that stores computer executable components; and
    a processor that executes the computer executable components stored in the memory, wherein the computer executable components comprise:
        a quantum programming component that receives quantum output data that includes a set of quantum results for a quantum circuit in response to simulation of the quantum circuit; and
        a post-processing component that adjusts the quantum output data associated with the quantum circuit based on client system data indicative of information for a client system that consumes the quantum output data, wherein the post-processing component generates a first layer associated with a first resolution for the quantum output data, and a second layer associated with a second resolution for the quantum output data, and wherein the first resolution associated with the first layer is different than the second resolution associated with the second layer.

2. The system of claim 1, wherein the post-processing component that adjusts the quantum output data associated with the quantum circuit based on a set of requirements for the client system.

3. The system of claim 1, wherein the post-processing component generates a plurality of layers of data for the quantum output data based on the client system data.

4. The system of claim 1, wherein the post-processing component generates a first version of the quantum output data and a second version of the quantum output data, and wherein the first version of the quantum output data is different than the second version of the quantum output data.

5. The system of claim 4, wherein the post-processing component transmits the first version of the quantum output data to the client system prior to the second version of the quantum output data.

6. The system of claim 1, wherein the post-processing component transmits the first layer associated with the first resolution for the quantum output data to the client system prior to the second layer associated with the second resolution for the quantum output data.

7. The system of claim 1, wherein the post-processing component adjusts streaming of the quantum output data to the client system based on the client system data.

8. The system of claim 1, wherein the post-processing component adjusts the quantum output data to improve performance of the quantum circuit.

9. A computer-implemented method, comprising:
    receiving, by a system operatively coupled to a processor, quantum output data generated by a quantum circuit in response to simulation of the quantum circuit;
    adjusting, by the system, the quantum output data associated with the quantum circuit based on client system data indicative of information for a client system that receives the quantum output data;
    generating, by the system, a first data layer associated with a first resolution for the quantum output data; and
    generating, by the system, a second data layer associated with a second resolution for the quantum output data.

10. The computer-implemented method of claim 9, wherein the adjusting comprises adjusting the quantum output data associated with the quantum circuit based on a set of requirements for the client system.

11. The computer-implemented method of claim 9, wherein the adjusting comprises generating a plurality of data layers for the quantum output data based on the client system data.

12. The computer-implemented method of claim 9, further comprising:
    generating, by the system, a first version of the quantum output data; and
    generating, by the system, a second version of the quantum output data that is different than the first version of the quantum output data.

13. The computer-implemented method of claim 12, further comprising:
    transmitting, by the system, the first version of the quantum output data to the client system prior to the second version of the quantum output data.

14. The computer-implemented method of claim 9, further comprising:
    transmitting, by the system, the first data layer associated with the first resolution for the quantum output data to the client system prior to the second data layer associated with the second resolution for the quantum output data.

15. The computer-implemented method of claim 9, wherein the adjusting comprises improving performance of the quantum circuit.

16. A computer program product for quantum data post-processing, the computer program product comprising a computer readable storage medium having program instructions embodied therewith, the program instructions executable by a processor to cause the processor to:
    receive, by the processor, quantum output data generated by a quantum circuit in response to simulation of the quantum circuit;
    adjust, by the processor, the quantum output data associated with the quantum circuit based on client system data indicative of a set of requirements for a client system that receives the quantum output data; and
    generate a first layer associated with a first resolution for the quantum output data, and a second layer associated with a second resolution for the quantum output data, and wherein the first resolution associated with the first layer is different than the second resolution associated with the second layer.

17. The computer program product of claim 16, wherein the program instructions are further executable by the processor to cause the processor to:
   generate, by the processor, a first version of the quantum output data; and
   generate, by the processor, a second version of the quantum output data that is different than the first version of the quantum output data.

18. The computer program product of claim 17, wherein the program instructions are further executable by the processor to cause the processor to:
   transmit, by the processor, the first version of the quantum output data to the client system prior to the second version of the quantum output data.

* * * * *